United States Patent [19]

Steere, III et al.

[11] Patent Number: 5,058,328
[45] Date of Patent: Oct. 22, 1991

[54] WAFER CENTERING ASSEMBLY

[75] Inventors: Robert E. Steere, III, Boonton, N.J.; Thomas E. Leonard, Vernon, Conn.

[73] Assignee: Silicon Technology Corporation, Oakland, N.J.

[21] Appl. No.: 463,244

[22] Filed: Jan. 10, 1990

[51] Int. Cl.$^5$ .............................................. B24B 47/02
[52] U.S. Cl. .............................. 51/215 E; 51/216 LP; 51/237 R
[58] Field of Search ........... 51/215 E, 216 LP, 216 T, 51/217 R, 217 T, 217 L, 236, 237 R, 235, 216 A, 217 A, 277; 125/35; 198/345; 269/903, 305, 34, 239, 307, 225

[56] References Cited

U.S. PATENT DOCUMENTS

| 774,563 | 11/1904 | Clark | 269/225 |
| 2,019,789 | 11/1935 | Mahannah | 269/71 |
| 2,418,463 | 4/1947 | Coleman | 125/35 |
| 2,887,918 | 5/1959 | Benson | 269/239 |
| 4,524,959 | 6/1985 | Kubo | 269/239 |
| 4,638,601 | 1/1987 | Steere et al. | 51/165.71 |
| 4,721,198 | 1/1988 | Yajima et al. | 198/345 |

FOREIGN PATENT DOCUMENTS 2458461 6/1976 Fed. Rep. of Germany ...... 323/269

Primary Examiner—M. Rachuba
Attorney, Agent, or Firm—Kenyon & Kenyon

[57] ABSTRACT

The wafer centering assembly includes a pair of pivot arms which can be pivoted simultaneously to adjust to the diameter of a conveyed wafer. Each pivot arm has a stop which arrest the motion of a wafer such that the axis of the wafer is approximately centered on the axis of a vacuum head.

13 Claims, 2 Drawing Sheets

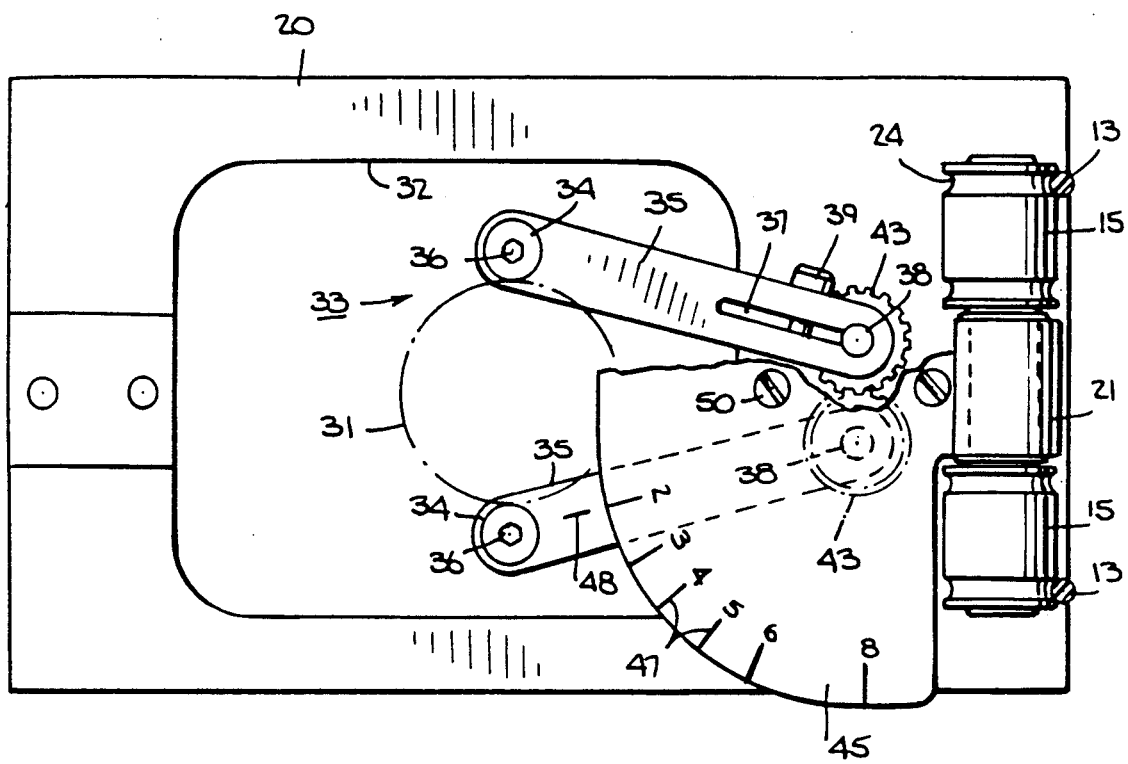
Fig. 2.
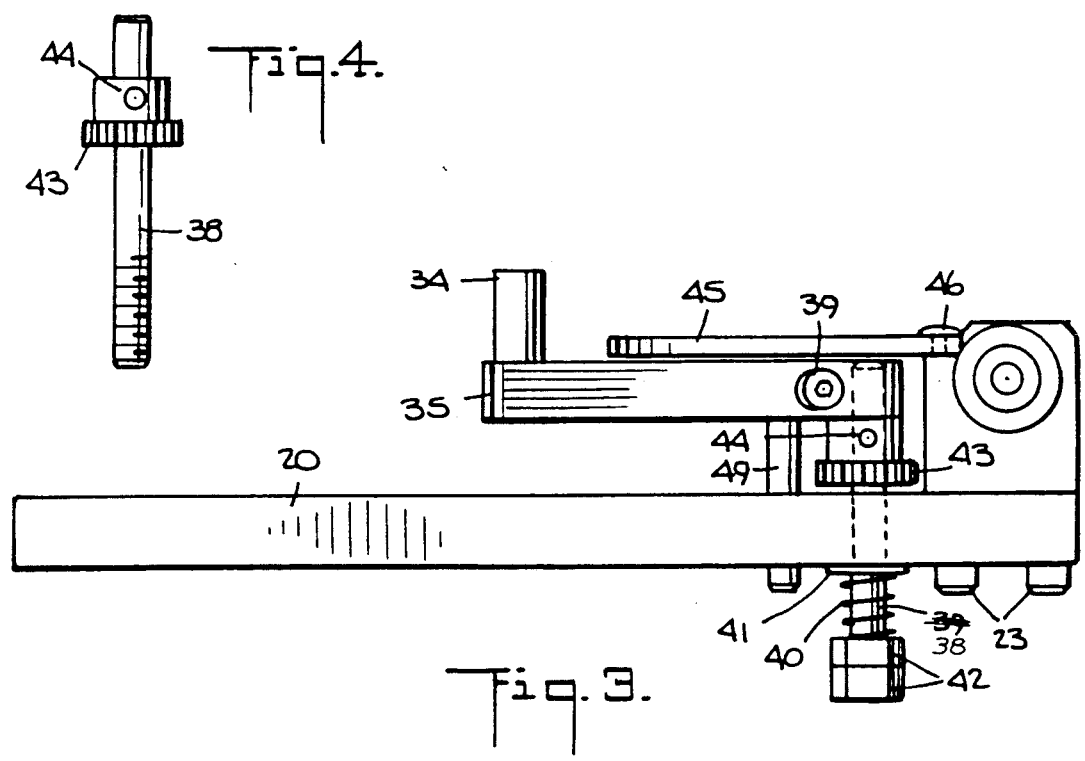
Fig. 4.
Fig. 3.

WAFER CENTERING ASSEMBLY

This invention relates to a wafer centering assembly. More particularly, this invention relates to a wafer centering assembly for use in an automatic edge grinder.

As is known, various types of operations are carried out in the processing of wafers, for example between a slicing stage in which a wafer is sliced from an ingot and a finished stage in which a wafer is separated into chips with circuitry thereon. During such processing, each wafer is moved from place to place and oriented in various manners to perform various functions.

For example, as described in U.S. Pat. No. 4,638,601 an automatic edge grinder has been provided with a centering station in which a wafer can be aligned with a longitudinal axis which extends through the centering station and a downstream grinding station in order to provide for an accurate grinding of the peripheral edge of the wafer. As described, the centering station employs a plurality of concentrically disposed arcuate centering stops, each of which is adjustably mounted to selectively abut and center a correspondingly sized wafer received in the centering station, for example on a vacuum head.

However, in some cases, the wafers directed to a centering station may have diameters which are different from those which are to be accommodated by arcuate centering stops.

Accordingly, it is an object of the invention to provide a wafer centering assembly which can be universely adapted to different sizes of wafers in a predetermined range of diameters.

It is another object of the invention to be able to readily adjust a wafer centering assembly to different sizes of wafers.

It is another object of the invention to permit a convenient, quick and simple change-over from one diameter setting to another in a wafer centering assembly.

It is another object of the invention to provide a wafer centering assembly which can be readily retrofitted to existing machines.

Briefly, the invention provides a wafer centering assembly which is comprised of a pair of stops for arresting movement of a moving wafer thereagainst, means for moving the stops simultaneously towards and away from each other to adapt to different diameters of the arrested wafers and registration (or sizing) means for selective setting of the stops at predetermined points corresponding to a diameter of a wafer to be centered.

The means for moving the stops includes a pair of pivotally mounted arms each of which has a respective stop mounted at a free end as well as means for pivoting the arms simultaneously toward and away from each other.

The construction of the centering assembly is such that the stops may be moved relative to each other so as to accommodate different sizes of wafers within a predetermined range of diameters, for example, from two inches to eight inches.

In order to facilitate registration of the stops, the registration means may be in the form of a plate which extends over the arms while permitting the strips to project upwardly out of the plane of the plate. In addition, the plate is provided with indicia which are indicative of the predetermined diameters of the wafers. In this respect, each arm may also have a registration mark for alignment with the indicia of the registration plate.

The wafer centering assembly can be incorporated into a conveyor which conveys a wafer along a predetermined path to a station for receiving the wafer. In this respect, the centering assembly may be mounted on the conveyor by means of a mounting plate while the conveyor is pivotally mounted at an end remote from the centering assembly so that upon pivoting of the conveyor, the centering assembly may be raised and lowered relative to the station for receiving the wafer.

These and other objects and advantages of the invention will become more apparent from the following detailed description taken in conjunction with the accompanying drawings wherein:

FIG. 2 illustrates a plan view of the wafer centering assembly constructed in accordance with the invention;

FIG. 3 illustrates a side view of the wafer assembly of FIG. 2; and

FIG. 4 illustrates a view of a means used to provide for simultaneous pivoting of the arms of the wafer centering assembly in accordance with the invention.

Figure 1:
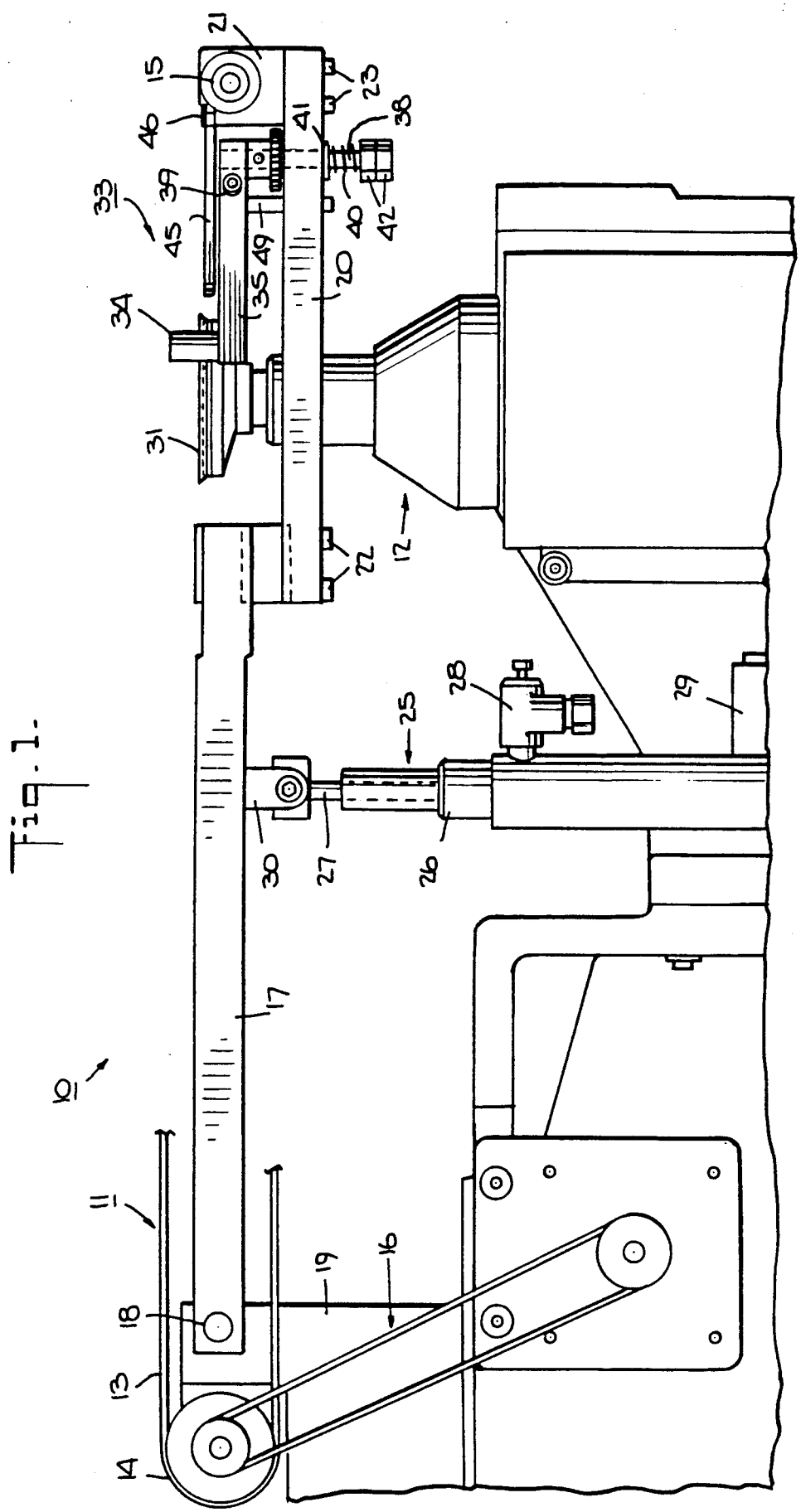
FIG. 1 illustrates a side view of a wafer receiving station of a wafer processing machine which employs a wafer centering assembly in accordance with the invention.

Referring to FIG. 1, the wafer processing machine 10 has a conveyor 11 and a station 12 for receiving a wafer (not shown) similar to that as described in U.S. Pat. No. 4,638,601 for the centering of a wafer. To this end, the conveyor 11 includes a pair of belts 13, for example, endless rubber belts, on which a wafer can be received and transported in a gentle manner. Generally, each wafer has a circular periphery with or without a flat thereon. Such wafers are of generally known shape and need not be further described.

The conveyor 11 has a pair of rollers 14, 15 at opposite ends over which the belts 13 are disposed so as to be driven. One roller 14 is connected with a suitable transmission 16 so as to be driven while the other roller 15 serves as a follower roller. In addition, the conveyor 11 has a plate 17 which is pivotally mounted via a pivot shaft 18 on a frame 19 of the machine 10. As indicated, the plate 17 carries a mounting plate 20 at one end which, in turn, carries a mounting block 21 for rotatable mounting of the roller 15 for the conveyor belts 13. As indicated the mounting plate 20 is secured by a pair of bolts 22 to this plate 17 while bolts 23 secure the block 21 to the plate 20.

As shown in FIG. 2, the roller 15 is provided with two sets of annular grooves 24 for receiving the belts 13 so as to accomodate differently sized wafers.

The machine 10 also has a means 25 for pivoting the conveyor plate 17 provided at an intermediate point. This means 25 includes a cylinder 26 secured to the machine frame 19 and a piston 27 which is reciprocably mounted within the cylinder 26. Suitable inlet and outlet connections 28, 29 are connected with the cylinder 26 so as to provide for hydraulic or pneumatic operation. As illustrated, the piston 27 is connected via an articulated linkage 30 to the bottom of the plate 17.

The station 12 for receiving a wafer includes a chuck or vacuum head 31, for example, as described in U.S. Pat. No. 4,638,601 and need not be further described. In this respect, the vacuum head 31 serves to retain a wafer in a fixed position once the wafer has been centered. As shown in FIG. 2, the mounting plate 20 has an enlarged opening 32 to permit passage of the vacuum head 31 or at least that part of the station 12 on which the head 31 is mounted.

Referring to FIGS. 2 and 3, a wafer centering assembly 33 is mounted on the mounting plate 20 to center a wafer on the vacuum head 31. This wafer centering assembly 33 includes a pair of stops 34 which are disposed on opposite sides of the path along which a wafer is moved by the conveyor belts 13. Each stop 34 is, in turn, mounted on a free end of a pivot arm 35 as by a locking screw 36 (see FIG. 2). Each pivot arm 35 is provided with an elongated slot 37 at an opposite end and fits over a pivot pin 38. In addition, a locking screw 39 is threaded into each arm 35 to pass through the slot 37 so that upon threading of the screw 39 into the arm 35, the slot 37 is closed down. In this way, the locking screw 39 serves to secure the arm to the pivot pin 38 in fixed manner.

Referring to FIG. 3, each pivot pin 38 is rotatably mounted in the mounting plate 20 and has a threaded lower end, as viewed. In addition, each pivot pin 38 cooperates with a holding means which serves to releasably hold each arm 35 in a selected position. As illustrated, the holding means is in the form of a coil spring 40 which is disposed about the pivot pin 38 and abutted against the mounting plate 20 via a washer 41 at one end and a pair of lock nuts 42 threaded onto the threaded portion of the pin 38 at the opposite end. By tightening of the lock nuts 42, the compression of the spring 40 is increased and, thus, the forces tending to hold the pin 38 against rotation within the plate 20.

The centering assembly 33 is also provided with a means for moving the arms 35 and, thus, the stops 34 simultaneously towards and away from each other in order to adapt to different diameters of arrested wafers. This means includes a pair of gears 43, each of which is secured on a pivot pin 38 via a roll pin 44 (see FIG. 4) in meshing relation with the other gear 43. Upon manual pivoting of one arm 35, the other arm 35 is caused to follow via the meshing gears 43.

The centering assembly 33 also includes a registration (or sizing) means for selective setting of the stops 34 at predetermined points corresponding to a diameters of a wafer, for example, in a range of diameters of from two inches to eight inches. As illustrated, the registration means is in the form of a plate 45 which extends over the arms 35 and which is secured to the mounting block 21 by means of a screw 46. In addition, the plate 45 has indicia 47 on one side indicative of the predetermined diameters of wafers which may be abutted by the centering assembly 33. In this respect, the arm 35 adjacent this side of the plate 45 has a registration mark 48 for alignment with the indicia of the registration plate 45.

The centering assembly 33 also includes a stop 49 which extends through the mounting plate 20 and which is secured to the registration plate 45 by means of a countersunk screw 50 (see FIG. 2). This stop 49 serves to limit the inward motion of one pivot arm 35 and thus both pivot arms 35.

During operation, the pivot arms 35 of the centering assembly 33 are moved into a position corresponding to the diameter of a wafer to be mounted on the vacuum head 31. As illustrated in FIG. 1, the stops 34 are disposed so as to project through the plane of the conveyor belts 13 in order to arrest the motion of a wafer being conveyed thereon. Each stop 34 is of cylindrical shape and is positioned on the respective arm 35 so as to abut a curvilinear periphery of wafer. The positioning of the stops 34 is such that, for example, for a two inch wafer, the center of the wafer would be approximately centered on the axis of the vacuum head 31.

Alternatively, should a wafer have a flat on the periphery, the flat may also be abutted against the stops 34. In this case, the center of the wafer would be eccentrically disposed relative to the axis of the vacuum head 31.

In either case, once a wafer has abutted against the stops 34, the entire centering assembly 33 is pivoted downwardly, as viewed, by means of the piston 27 of the means 25. That is, the plate 17 of the conveyor 11 is pivoted downwardly so as to bring the stops 34 below the plane of the wafer. The wafer may then be processed while on the vacuum head 31 and thereafter removed, for example, in the manner as described in U.S. Pat. No. 4,638,601 for further processing. After a wafer has been removed from the vacuum head 31, the conveyor plate 17 is again raised to position the stops 34 in the path of the next wafer.

In the event that the size of a wafer to be conveyed along the conveyor 11 is different from a previously conveyed wafer, the arms 35 are manually adjusted to accommodate the new diameter. For example, for a four inch wafer, this can be simply accomplished by manually moving one arm 35 to line up the registration mark 48 with the appropriate indicia 47 on the plate, ie. a position corresponding to the 4 inch diameter wafer. The second arm follows via the meshing gears 43.

In the event that adjustments are required in fixing the pivot arms 35 in place, the lock nuts 42 of the holding means can be threaded further onto the pivot pins 38 so as to compress the springs 40 to a greater degree.

The invention thus provides a wafer centering assembly which can be readily adjusted to different sizes of wafers, for example, wafers having a diameter in the range of from two inches to eight inches. Further, the centering assembly can be readily and quickly changed over from one diameter setting to another.

The invention further provides a wafer centering assembly which can be readily field retrofitted to existing machines.

The invention further provides a wafer centering assembly which can be manufactured and assembled in a relatively economical manner so as to lead to lower costs of manufacture and processing of wafers.

What is claimed is:

1. In a wafer centering assembly the combination comprising
   a pair of stops for arresting movement of a moving wafer thereagainst;
   means for moving said stops simultaneously towards and away from each other to adapt to different diameters of arrested wafers; and
   sizing means for selective setting of said stops at predetermined points corresponding to a diameter of a wafer.

2. The combination as set forth in claim 1 wherein said means for moving said stops includes a pair of pivotally mounted arms, each arm having a respective stop mounted at a free end thereof and means for pivoting said arms simultaneously toward and away from each other.

3. The combination as set forth in claim 2 wherein said sizing means is a plate extending over said arms and having indicia thereon indicative of predetermined diameters and wherein each arm has a registration mark for alignment with said indicia of said plate.

4. The combination as set forth in claim 2 which further comprises a mounting plate having said arms pivotally mounted thereon in parallel relation.

5. The combination as set forth in claim 1 which further comprises holding means for releasably holding each arm in a selected position relative to said sizing means.

6. The combination as set forth in claim 5 wherein said holding means includes a spring.

7. In a wafer centering assembly, the combination comprising
   a mounting plate:
   a pair of pivot shafts rotatably mounted in said plate;
   a pair of arms disposed in parallel to said plate, each arm being secured to a respective shaft for pivoting therewith;
   a pair of stops, each said stop being disposed in upstanding manner on a free end of a respective arm to arrest movement of a wafer thereagainst; and
   means for pivoting said arms simultaneously towards and away from each other.

8. The combination as set forth in claim 7 which further comprises sizing means for selective setting of said arms at predetermined points corresponding to a diameter of a wafer.

9. The combination as set forth in claim 8 wherein said sizing means is a plate extending over said arms and having indicia thereon indicative of predetermined diameters.

10. The combination as set forth in claim 9 wherein at least one arm has a registration mark for alignment with a selected indicium of said indicia of said plate.

11. The combination as set forth in claim 7 which further comprises a pair of holding means for releasably holding each pivot shaft in a selected position.

12. The combination as set forth in claim 11 wherein each said holding means includes a coiled spring about a respective pivot shaft and abutting said mounting plate at one end, and a pair of locking nuts threadably secured on said respective shaft against a second end of said spring.

13. The combination as set forth in claim 7 wherein said means for pivoting said arms includes a pair of gears, each said gear being secured on a respective shaft in meshing relation with the other gear.

* * * * *